United States Patent
Fujino et al.

(10) Patent No.: US 9,433,075 B2
(45) Date of Patent: Aug. 30, 2016

(54) ELECTRIC POWER SEMICONDUCTOR DEVICE

(71) Applicant: Mitsubishi Electric Corporation, Chiyoda-ku (JP)

(72) Inventors: Junji Fujino, Chiyoda-ku (JP); Yutaka Yoneda, Chiyoda-ku (JP); Yoshitaka Onishi, Chiyoda-ku (JP); Masafumi Sugawara, Chiyoda-ku (JP)

(73) Assignee: MITSUBISHI ELECTRIC CORPORATION, Chiyoda-Ku, Tokyo ( * ) Notice: Subject to any disclaimer, the term of this patent is extended or adjusted under 35 U.S.C. 154(b) by 40 days.

(21) Appl. No.: 14/417,370

(22) PCT Filed: Aug. 9, 2013

(86) PCT No.: PCT/JP2013/071622
§ 371 (c)(1),
(2) Date: Jan. 26, 2015

(87) PCT Pub. No.: WO2014/034411
PCT Pub. Date: Mar. 6, 2014

(65) Prior Publication Data
US 2015/0223316 A1 Aug. 6, 2015

(30) Foreign Application Priority Data

Aug. 27, 2012 (JP) .................................. 2012-186243

(51) Int. Cl.
*H05K 7/20* (2006.01)
*H05K 1/02* (2006.01)
(Continued)

(52) U.S. Cl.
CPC ............. *H05K 1/0203* (2013.01); *H01L 23/13* (2013.01); *H01L 23/36* (2013.01);
(Continued)

(58) Field of Classification Search
CPC .............................. G06F 1/181–1/182; H05K 7/20218–7/20381; H05K 7/20409–7/20418; H05K 7/20009–7/202; H01L 23/46–23/3677

USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236

See application file for complete search history.

(56) References Cited

U.S. PATENT DOCUMENTS 5,463,250 A   10/1995   Nguyen et al.
6,060,772 A    5/2000   Sugawara et al.
(Continued)

FOREIGN PATENT DOCUMENTS

JP   4-109690 A   4/1992
JP    7-7033 A    1/1995
(Continued)

OTHER PUBLICATIONS

International Search Report (PCT/ISA/210) mailed on Oct. 29, 2013, by the Japanese Patent Office as the International Searching Authority for International Application No. PCT/JP2013/071622.
(Continued)

*Primary Examiner* — Anthony Haughton
*Assistant Examiner* — Razeem Gafur
(74) *Attorney, Agent, or Firm* — Buchanan Ingersoll & Rooney PC

(57) ABSTRACT

An electric power semiconductor device includes a heat transfer plate. A printed wire board is spaced a predetermined gap apart from the heat transfer plate. An opening portion is provided in the vicinity of an electrode strip formed on the outer side of the printed wire board. An electric power semiconductor element is disposed between the heat transfer plate and the printed wire board, and adhered to the heat transfer plate. A wiring member has one end bonded to a first bonding portion of a main power electrode of the electric power semiconductor element, and the other end is bonded to a second bonding portion. At least part of the second bonding portion is included in a space that extends from the main power electrode to the printed wire board, and the first bonding portion is included in a space that extends from the opening portion.

19 Claims, 4 Drawing Sheets

(51) Int. Cl.

| | | |
|---|---|---|
| *H01L 23/13* | (2006.01) | |
| *H01L 23/36* | (2006.01) | |
| *H01L 23/373* | (2006.01) | |
| *H01L 23/492* | (2006.01) | |
| *H01L 23/00* | (2006.01) | |
| *H01L 25/18* | (2006.01) | |
| *H01L 23/473* | (2006.01) | |
| *H01L 25/07* | (2006.01) | |

(52) U.S. Cl.
CPC ........ *H01L 23/3735* (2013.01); *H01L 23/492* (2013.01); *H01L 24/37* (2013.01); *H01L 24/40* (2013.01); *H01L 24/41* (2013.01); *H01L 24/73* (2013.01); *H01L 24/92* (2013.01); *H01L 25/07* (2013.01); *H01L 25/18* (2013.01); *H01L 24/06* (2013.01); *H01L 24/29* (2013.01); *H01L 24/32* (2013.01); *H01L 24/45* (2013.01); *H01L 24/48* (2013.01); *H01L 24/49* (2013.01); *H01L 24/83* (2013.01); *H01L 24/84* (2013.01); *H01L 24/85* (2013.01); *H01L 25/072* (2013.01); *H01L 2224/04026* (2013.01); *H01L 2224/04034* (2013.01); *H01L 2224/04042* (2013.01); *H01L 2224/0603* (2013.01); *H01L 2224/06181* (2013.01); *H01L 2224/29111* (2013.01); *H01L 2224/32245* (2013.01); *H01L 2224/37012* (2013.01); *H01L 2224/37147* (2013.01); *H01L 2224/4005* (2013.01); *H01L 2224/4024* (2013.01); *H01L 2224/40105* (2013.01); *H01L 2224/4118* (2013.01); *H01L 2224/45015* (2013.01); *H01L 2224/45124* (2013.01); *H01L 2224/45144* (2013.01); *H01L 2224/45147* (2013.01); *H01L 2224/4824* (2013.01); *H01L 2224/48091* (2013.01); *H01L 2224/48472* (2013.01); *H01L 2224/49175* (2013.01); *H01L 2224/73263* (2013.01); *H01L 2224/73265* (2013.01); *H01L 2224/8346* (2013.01); *H01L 2224/83424* (2013.01); *H01L 2224/83447* (2013.01); *H01L 2224/83801* (2013.01); *H01L 2224/84447* (2013.01); *H01L 2224/84801* (2013.01); *H01L 2224/85205* (2013.01); *H01L 2224/92247* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/1576* (2013.01); *H01L 2924/15724* (2013.01); *H01L 2924/15747* (2013.01); *H01L 2924/16152* (2013.01); *H01L 2924/16172* (2013.01); *H01L 2924/16251* (2013.01); *H01L 2924/181* (2013.01); *H01L 2924/19107* (2013.01)

(56) References Cited

U.S. PATENT DOCUMENTS

| | | | |
|---|---|---|---|
| 6,424,026 B1 | 7/2002 | Mangtani | |
| 2001/0033477 A1* | 10/2001 | Inoue | H01L 23/4006 361/718 |
| 2002/0131237 A1* | 9/2002 | Snyder | F28D 15/0233 361/719 |
| 2002/0145195 A1* | 10/2002 | Okamoto | C22C 1/1036 257/720 |
| 2002/0158333 A1* | 10/2002 | Teshima | H01L 21/565 257/718 |
| 2002/0180037 A1* | 12/2002 | Shirakawa | H01L 24/72 257/727 |
| 2002/0186545 A1* | 12/2002 | Fukada | H01L 23/473 361/719 |
| 2003/0067748 A1* | 4/2003 | Tamba | H05K 7/20927 361/699 |
| 2003/0067749 A1* | 4/2003 | Tamba | H05K 7/20927 361/699 |
| 2005/0073043 A1* | 4/2005 | Teshima | H01L 21/565 257/718 |
| 2005/0230816 A1* | 10/2005 | Kurauchi | H01L 23/3107 257/706 |
| 2005/0231914 A1* | 10/2005 | Mikubo | G06F 1/20 361/699 |
| 2005/0231990 A1 | 10/2005 | Uno et al. | |
| 2006/0120047 A1* | 6/2006 | Inoue | H01L 23/4006 361/699 |
| 2006/0138452 A1* | 6/2006 | Knapp | H01L 23/051 257/177 |
| 2006/0232939 A1* | 10/2006 | Inoue | H01L 23/4006 361/704 |
| 2006/0268510 A1* | 11/2006 | Jeong | H05K 7/20963 361/689 |
| 2008/0246130 A1* | 10/2008 | Carney | H01L 23/4334 257/675 |
| 2009/0026544 A1 | 1/2009 | Uno et al. | |
| 2009/0033221 A1* | 2/2009 | Lee | H05K 7/20963 313/582 |
| 2009/0086431 A1* | 4/2009 | Sakamoto | H05K 7/20009 361/695 |
| 2009/0231810 A1* | 9/2009 | Liang | H01L 23/473 361/699 |
| 2010/0128441 A1* | 5/2010 | Soda | H01L 25/115 361/709 |
| 2010/0208427 A1* | 8/2010 | Horiuchi | H05K 7/20927 361/699 |
| 2010/0259898 A1* | 10/2010 | Kimura | H05K 7/209 361/704 |
| 2011/0037449 A1 | 2/2011 | Uno et al. | |
| 2011/0096496 A1* | 4/2011 | Doo | H01F 27/025 361/689 |
| 2011/0170017 A1* | 7/2011 | Liu | G02F 1/133308 348/739 |
| 2011/0291295 A1 | 12/2011 | Isa et al. | |
| 2011/0317368 A1* | 12/2011 | Pautsch | H01L 23/473 361/702 |
| 2012/0049337 A1 | 3/2012 | Uno et al. | |

FOREIGN PATENT DOCUMENTS

| | | |
|---|---|---|
| JP | 10-12812 A | 1/1998 |
| JP | 11-074433 A | 3/1999 |
| JP | 2004-31590 A | 1/2004 |
| JP | 2004-214522 A | 7/2004 |
| JP | 2005-310907 A | 11/2005 |
| JP | 3143893 U | 7/2008 |
| JP | 2009-76750 A | 4/2009 |
| JP | 2009-231296 A | 10/2009 |
| JP | 2009231296 A | 10/2009 |
| JP | 2009252771 A | 10/2009 |
| JP | 2010-010434 A | 1/2010 |
| JP | 2011-249582 A | 12/2011 |
| JP | 2012-109521 A | 6/2012 |
| JP | 2012-169520 A | 9/2012 |

OTHER PUBLICATIONS

Office Action (Notification of Reasons for Refusal) dated Sep. 29, 2015, issued by the Japanese Patent Office in corresponding Japanese Patent Application No. 2014-532910, and an English translation of the Office Action. (9 pages).

Extended European Search Report dated Apr. 6, 2016, issued by the European Patent Office in the corresponding European Application No. 13832786.1. (11 pages).

Japanese Office Action dated May 10, 2016 issued in corresponding Japanese Patent Appln. No. 2014-532910, with English translation (7 pages).

\* cited by examiner

ELECTRIC POWER SEMICONDUCTOR DEVICE

TECHNICAL FIELD

The present invention relates to a semiconductor device and particularly to an electric power semiconductor device that needs heat radiation performance.

BACKGROUND ART

Electric power semiconductor devices have been widely spreading in all products such as industrial apparatuses, consumer electrical appliances, and information terminals; in particular, downsizing and high-reliability are required in consumer electrical appliances. Moreover, because an electric power semiconductor device deals with a high voltage and a large current, a great deal of heat is generated; thus, it is required to efficiently radiate the heat to the outside. Furthermore, it is also required that a wide bandgap semiconductor material such as SiC, which may be mainly utilized in the years to come because of a high operating temperature and a high efficiency thereof, can be applied to an electric power semiconductor device.

In general, in a small electric power semiconductor device, an electric power semiconductor element is often disposed on a substrate on which an electric circuit is formed; when heat generated in the electric power semiconductor element is radiated to the outside through the substrate, the heat conductivity of the substrate itself provides a large effect to the heat radiation performance. However, an AlN substrate, which allegedly has superior heat conductivity, is difficult to obtain. In contrast, an alumina substrate or a glass-epoxy substrate, which is easily obtained, has heat conductivity of only one-twentieth to one-thousandth of the heat conductivity of high-heat-conductivity metal such as copper; therefore, high heat radiation performance cannot be expected.

Accordingly, it is conceivable that in order to secure the heat radiation performance, the rear side of an electric power semiconductor element is directly connected with a heat radiation material through a high-heat-conductivity insulating layer. In that case, it is conceivable that wiring of the front side thereof is implemented by soldering the front side with an interposer substrate (e.g., refer to Patent Document 1). However, the electrode on the surface of a common electric power semiconductor element formed under the assumption of wire bonding is not suitable for soldering; therefore, soldering requires special machining. Thus, it is conceivable that an electric power semiconductor element is inserted into the opening of an interposer substrate and a technology (e.g., refer to Patent Document 2 or 3) in which wiring of a common electric power semiconductor element can be implemented through wire bonding is utilized.

PRIOR ART REFERENCE

Patent Document

[Patent Document 1] Japanese Patent Application Laid-Open No. H10-12812 (Paragraphs 0012 through 0020, and FIGS. 4 and 5)

[Patent Document 2] Japanese Patent Application Laid-Open No. H7-7033 (Paragraphs 0009 through 0012, and FIGS. 1 and 2)

[Patent Document 3] Japanese Patent Application Laid-Open No. 2004-214522 (Paragraphs 0022 through 0027, FIG. 3)

DISCLOSURE OF THE INVENTION

Problems to be Solved by the Invention

However, such a structure as described above requires that a gap is provided in the plane-extending direction between the electric power semiconductor element and the interposer substrate; therefore, there has been a problem that in comparison with normal bare chip mounting in which an electric power semiconductor element and an electrode strip are arranged on a substrate, the mounting area is enlarged.

The present invention has been implemented in order to solve the foregoing problems; the objective thereof is to readily obtain a small-size electric power semiconductor device that has superior heat radiation performance.

Means for Solving the Problems

An electric power semiconductor device according to the present invention is provided with a heat transfer plate, to the side opposite to the mounting side of which a heat radiation material is adhered through an insulating layer, a printed wire board that is disposed in such a way as to face, with a predetermined gap, the mounting side of the heat transfer plate, on the side of which, opposite to the side facing the heat transfer plate, an electrode strip is formed, and in the vicinity of the electrode strip of which, an opening portion is provided, an electric power semiconductor element that is disposed between the heat transfer plate and the printed wire board and whose rear side is adhered to the mounting side of the heat transfer plate, and a wiring member, one end of which is bonded to a first bonding portion of an element electrode formed on the front side of the electric power semiconductor element and the other end of which is bonded to a second bonding portion of the electrode strip; the electric power semiconductor device is characterized in that the electrode strip and the opening portion are arranged in such a way that at least part of the second bonding portion is included in a space that extends from the element electrode to the printed wire board in a direction vertical to the mounting side and in such a way that the first bonding portion is included in a space that extends from the opening portion to the element electrode in the vertical direction.

Advantage of the Invention

Because the present invention makes it possible to make the electrode strip of the printed wire board approach the electrode-surface region of the electric power semiconductor element, it is made possible to readily obtain a small-size electric power semiconductor device that has superior heat radiation performance.

BEST MODE FOR CARRYING OUT THE INVENTION

Embodiment 1

Figure 1A:
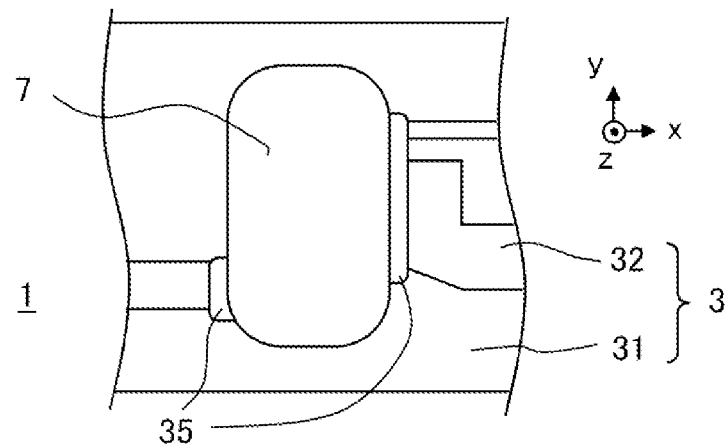
FIG. 1A, FIG. 1B and FIG. 1C are views for explaining the configuration of an electric power semiconductor device according to Embodiment 1 of the present invention, including a partial plan view of the electric power semiconductor device, a partial plan view when looked through some materials, and a partial cross-sectional view.
Figure 1B:
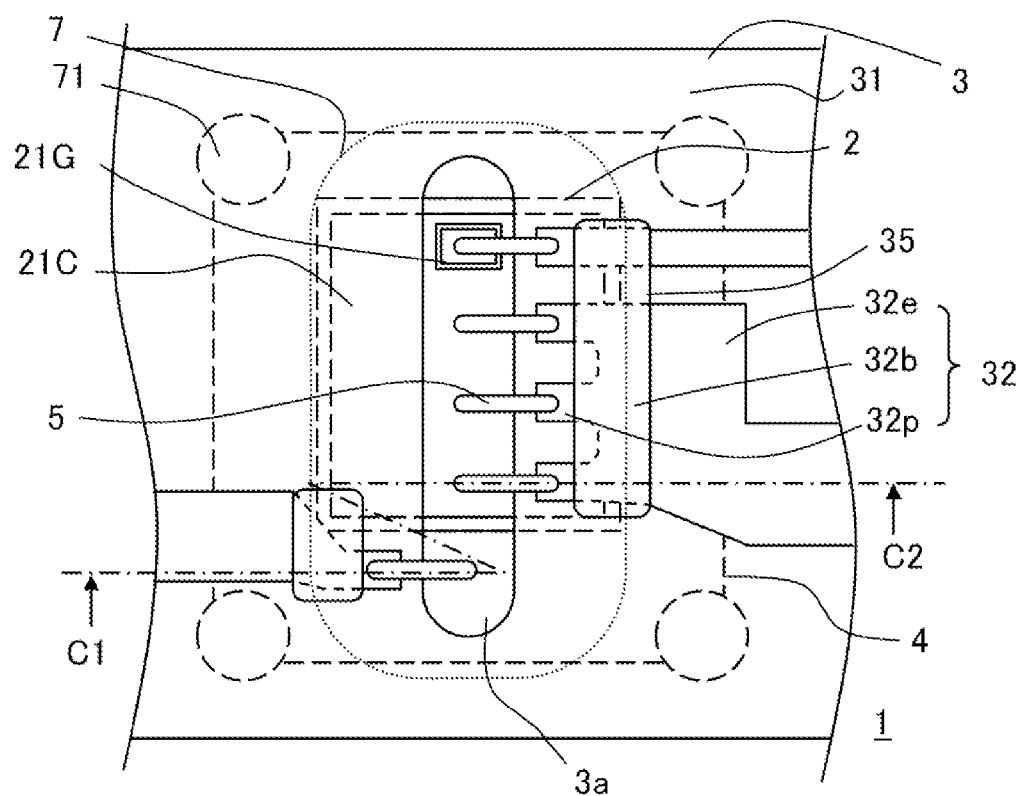
Figure 1C:
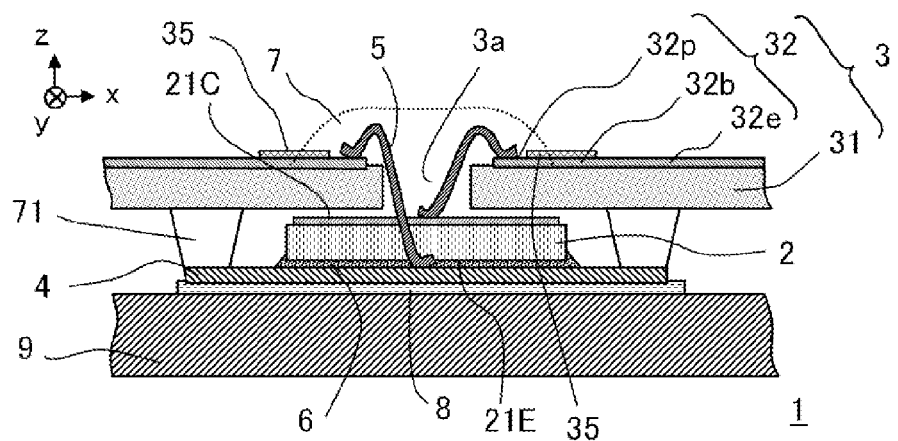

FIG. 1A, FIG. 1B and FIG. 1C are views for explaining the configurations of an electric power semiconductor device according to Embodiment 1 of the present invention; FIG. 1A is a partial plan view of the electric power semiconductor device; FIG. 1B is a plan view illustrating the same portion as FIG. 1A when looked through a sealing resin and the base material portion of an interposer substrate; FIG. 1C is a cross-sectional view including different cross-sectional positions taken by the line C1-C2 (parallel lines) in FIG. 1B when the sealing resin portion is removed.

In an electric power semiconductor device 1 according to Embodiment 1, the rear side electrode of an electric power semiconductor element is adhered to one side, of a heat spreader, that is opposite to the other side, of the heat spreader, on which a heat radiation material is mounted; furthermore, the front side electrode, on the surface of the electric power semiconductor element, for making main power flow is electrically connected through wire bonding with the portions, of electrode strips formed on the interposer substrate, that overlap part of the front side electrode when viewed in a direction that is perpendicular to the plane of the front side electrode. The details will be explained below.

As illustrated in FIGS. 1B and 1C, an aluminum chassis, which functions as a heat radiation material 9, is attached to the rear side of a copper heat spreader 4 (15 mm×20 mm×1 mm (thickness)) through an insulating layer 8; a rear side electrode 21E of an IGBT (Insulated Gate Bipolar Transistor) of 10 mm×10 mm, which is an electric power semiconductor element 2, is adhered to the front side of the heat spreader 4 by use of solder 6 (Sn—Ag—Cu, melting point: 217° C.). At the front side, of the heat spreader 4, to which the electric power semiconductor element 2 is adhered, an interposer substrate 3 is disposed through a potting resin 71 in such a way as to face, with a predetermined gap, the heat spreader 4. In other words, the electric power semiconductor element 2 is disposed in the gap between the heat spreader 4 and the interposer substrate 3 in such a way that the rear side thereof is adhered to the heat spreader 4 and the front side thereof faces the rear side of the interposer substrate 3.

In the interposer substrate 3, a copper electrode strip 32 is formed on an glass-epoxy substrate 31 formed by impregnating glass fibers with an epoxy resin; the interposer substrate 3 is provided in such a way that at least part of a main power electrode 21C and a control electrode 21G, which are electrodes at the front side of the electric power semiconductor element 2, are exposed from an opening portion 3a (width 2 mm×length 15 mm). Out of the electrode strip 32, at least a bonding electrode 32p (wire bonding pad) to be connected with the main power electrode 21C (for example, a collector electrode) at the front side of the electric power semiconductor element 2 is disposed at a position where the bonding electrode 32p overlaps at least part of the main power electrode 21C when viewed in a direction (z) that is perpendicular to the plane of the interposer substrate 3.

The portions exposed from the opening portion 3a of the main power electrode 21C include a bonding position for connecting the main power electrode 21C with the bonding electrode 32p and a space required for bonding. Accordingly, the main power electrode 21C on the front side of the electric power semiconductor element 2 and the bonding electrode 32p can be connected with each other through wire bonding utilizing an aluminum bonding wire 5 having a thickness of 0.5 mm from a position above the interposer substrate. In this situation, the stroke length, in the extending direction of the plane (xy), of the bonding wire 5 is shorter than the distance (5 mm) between the center and the end of the main power electrode 21C. In Embodiment 1, a bonding electrode 32p to be connected with the control electrode 21G (for example, a gate electrode) is also disposed at a position where the bonding electrode 32p overlaps at least part of the main power electrode 21C when viewed in the direction that is perpendicular to the plane of the interposer substrate 3. As is the case with the main power electrode 21C, the control electrode 21G is electrically connected with the gate-electrode bonding electrode 32p by use of a short-stroke-length bonding wire 5.

The opening portion 3a has an opening that is longer than the y-direction length of the electric power semiconductor element 2. A predetermined position, of the heat spreader 4, that is exposed from the opening portion 3a is electrically connected with another bonding electrode 32p by use of the bonding wire 5.

The space between the heat spreader 4 and the interposer substrate 3 and a predetermined region on the front side of the interposer substrate 3 is sealed with a sealing member 7 formed of a resin in such a way that the electric power semiconductor element 2 and the bonding wires 5 are wrapped. As a result, the electric power semiconductor device 1 having such an appearance (partial appearance) as illustrated in FIG. 1A is formed. In the electrode strip 32, the bonding electrode 32p communicates with an external terminal portion 32e (the exposed portion thereof in FIG. 1A) byway of a portion coated with a solder resist 35. As a result, the external terminal portion 32e exposed from the sealing member 7 electrically connects the respective electrodes 21C, 21G, and 21E formed on the electric power semiconductor element 2 with the outside.

In the electric power semiconductor device 1 configured as described above, the opening portion 3a provided in the interposer substrate 3 is disposed in the situation where the bonding electrode 32p to be connected with the main power electrode 21C on the front side of the electric power semiconductor element 2 overlaps at least part of the main power electrode 21C. Accordingly, the electrode strip 32 can be formed in such a way as to occupy some part of the region of the electric power semiconductor element 2 in the plane-extending direction (xy); thus, the mounting area can be suppressed. Because it is not required that the insulating layer 8 for making the heat spreader 4 and the heat radiation material 9 adhere to each other has such a rigidity as that of a circuit board, the heat conductivity can readily be secured.

When the electric power semiconductor device 1 configured as described above is made to operate, a current flows in the electric power semiconductor element 2 and hence the electric power semiconductor element 2 gains heat. The heat generated in the electric power semiconductor element 2 is transferred to the heat radiation material 9 through the heat spreader 4. In this situation, the electric power semiconductor element 2 communicates with the heat radiation material 9 through materials having a high heat conductivity; therefore, the generated heat can efficiently be radiated from the heat radiation material 9. In other words, the opening portion 3a, the positional relationship with the electric power semiconductor element 2 is adjusted, is provided so that no processing for soldering is implemented; therefore, even when there is utilized an electric power semiconductor element for which it is required to implement wiring that needs operation in a predetermined direction as is the case with ultrasonic wire bonding, a compact, high-radiation-performance, and high-reliability electric power semiconductor device can be obtained.

It is required that the width (in a direction that is parallel to the wire bonding: in the x direction in FIG. 1) of the opening portion 3a is larger than the bonding length of the wire bonding; when the insertion space of the tool for wire bonding is taken into consideration, the width should be the same as or larger than 200% of the wire diameter.

In many cases, a high-flexibility material is utilized for the sealing member 7 in order to prevent the bonding wire 5 from being deformed and to secure the high insulating performance. The potting resin 71, which functions as a spacer, is required in order to form a desired gap between the heat spreader 4 and the interposer substrate 3; the potting resin 71 demonstrates an effect of preventing the surface of the electric power semiconductor element 2 having a complex shape such as a trench structure from directly making contact with the interposer substrate 3. In order to secure the heat radiation performance, the interposer substrate 3 is often screwed to the heat radiation material 9 for the purpose of pressing the heat spreader 4 against the heat radiation material 9. The potting resin 71, which functions as a spacer, receives the stress and transfers it to the heat spreader 4, so that there is demonstrated an effect of preventing the high-flexibility sealing member from being deformed and transferring the stress to the electric power semiconductor element 2 and the bonding wire 5. Accordingly, the harder is the potting resin 71 (the higher is the elastic modulus thereof) in comparison with the sealing member 7, the larger effect can be demonstrated.

Embodiments after and including Embodiment 1 are explained with the interposer substrate 3, as an example, that is a kind of printed wire board; however, the embodiments are not limited to the interposer substrate 3, but can be applied to various kinds of printed wire board including, for example, a mother substrate. In other words, in an electric power semiconductor device according to each of the embodiments after and including Embodiment 1, the interposer substrate 3 can be utilized as a printed wire board.

As described above, the electric power semiconductor device 1 according to Embodiment 1 is provided with a heat spreader 4, which is a heat transfer plate, to the side opposite to the mounting side of which the heat radiation material 9 is adhered through the insulating layer 8; a printed wire board (the interposer substrate 3) that is disposed in such a way as to face, with a predetermined gap, the mounting side of the heat transfer plate (heat spreader 4), on the (outer) side of which, opposite to the (inner) side facing the heat transfer plate (heat spreader 4), the electrode strip 32 is formed, and in the vicinity of the electrode strip 32 of which, the opening portion 3a is provided; the electric power semiconductor element 2 that is disposed between the heat transfer plate (heat spreader 4) and the printed wire board (interposer substrate 3) and whose rear side is adhered to the mounting side of the heat transfer plate (heat spreader 4); and the bonding wire 5, which is a wiring member, one end of which is bonded to a first bonding portion of, for example, the main power electrode 21C which is an element electrode formed on the front side of the electric power semiconductor element 2 and the other end of which is bonded to the bonding electrode 32p which is a second bonding portion of the electrode strip 32. At least part of the second bonding portion (bonding electrode 32p) is included in a space that extends from the element electrode (main power electrode 21C) to the printed wire board (interposer substrate 3) in the direction (z) vertical to the mounting side, and the electrode strip 32 and the opening portion 3a are arranged in such a way that the first bonding portion is included in a space that extends from the opening portion 3a to the element electrode (main power electrode 21C) in the vertical (z) direction. As a result, the heat radiation performance can be secured; on top of that, even when without utilizing an electric power semiconductor element whose surface electrode is adjusted for soldering, wiring is implemented through ultrasonic bonding that requires operation from the front side, it is made possible that the electrode strip 32 overlaps the region of the front side electrode so that the mounting area is reduced. In other words, it is made possible to readily obtain a small-size electric power semiconductor device that has superior heat radiation performance.

Almost all of the front side of the electric power semiconductor element 2 is configured with wire bonding electrodes, and in order to expose all of the electrodes, it is required to form a slit (corresponding to the opening portion 3a in Embodiment 1) larger than the electric power semiconductor element 2; therefore, there has been a problem that the mounting area is enlarged in comparison with a normal bare chip mounting. However, in the electric power semiconductor device 1 according to Embodiment 1, at least part of the electrode strip 32 on the printed wire board (interposer substrate 3) to be connected overlaps the front side electrode of the electric power semiconductor element 2 when viewed from the upper side (from a position apart from the electric power semiconductor element 2 in a direction vertical to the mounting side). Accordingly, downsizing of the slit (opening portion 3a) makes it possible to achieve downsizing of the mounting area and the occupation area of the printed wire board (interposer substrate 3).

In particular, the wiring member is the bonding wire 5, which is a wire for bonding, and the opening portion 3a includes a region required for bonding the bonding wire 5 to the first bonding portion of the element electrode (main power electrode 21C); therefore, it is made possible to implement bonding through the opening portion 3a and hence an electric power semiconductor device can efficiently be produced. Moreover, because the stroke length of the bonding is reduced, the electric resistance can also be decreased.

The electric power semiconductor element 2 is a vertical semiconductor element such as an IGBT, also on the rear side of which the electrode 21E is formed, and the bonding wire 5, which is a wiring member, electrically connects the heat transfer plate (heat spreader 4) to which the electrode 21E is adhered with another bonding portion (another bonding electrode 32p) of the electrode strip 32, through the opening portion 3a; therefore, it is made possible to readily obtain electric power semiconductor device 1 that is small-size and has superior heat radiation performance.

Embodiment 2

Figure 2:
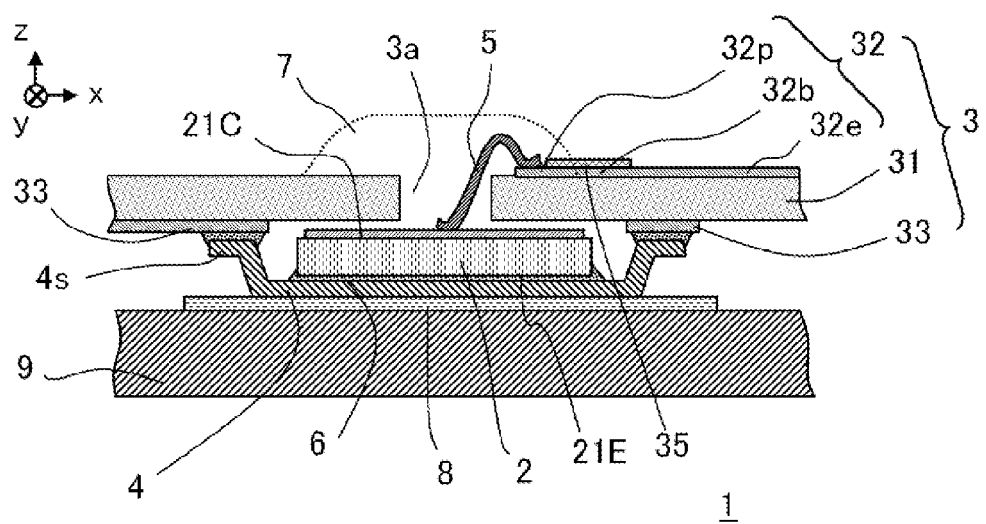
FIG. 2 is a partial cross-sectional view for explaining the configuration of an electric power semiconductor device according to Embodiment 2 of the present invention.

In Embodiment 2, the supporting structure for the interposer substrate is changed, in comparison with Embodiment 1, and the electric connection path is also changed by utilizing the supporting structure. FIG. 2 is a partial cross-sectional view for explaining the configuration of an electric power semiconductor device according to Embodiment 2 and corresponds to FIG. 1C in Embodiment 1; however, the cutting position corresponds to the portion where the line C2 in FIG. 1B is extended. In FIG. 2, the constituent elements that are the same as those explained in Embodiment 1 are designated by the same characters and the explanation therefor will be omitted.

As illustrated in FIG. 2, in Embodiment 2, the both ends of the heat spreader 4 are made to rise from the mounting side so that a tray shape is formed; then, a supporting portion 4s formed at each of the both ends supports the interposer substrate 3. On the rear side of the interposer substrate 3, a rear side electrode strip 33 is formed at a position corresponding to the position of the supporting portion 4s; by soldering the rear side electrode strip 33 with the supporting portion 4s, the position, with respect to the heat spreader 4, of the interposer substrate 3 is fixed. Accordingly, the potting resin 71 explained in Embodiment 1 is not utilized.

Furthermore, part of the rear side electrode strip 33 of the interposer substrate 3 extends to the outside of the sealing member 7 and can be electrically connected with the outside at that portion. As a result, because connection with the rear side electrode 21E of the electric power semiconductor element 2 does not require the wire bonding through the opening portion 3a described in Embodiment 1, the length of the opening portion 3a can be made shorter than the length of the main power electrode 21C on the front side. Accordingly, the restriction on the arrangement of the front side electrode strip 32 is reduced; thus, the mounting area can further be reduced.

As described above, in the electric power semiconductor device 1 according to Embodiment 2 of the present invention, the supporting portion 4s that rises from the mounting side to the printed wire board (interposer substrate 3) and supports the printed wire board (interposer substrate 3) is formed at each of the both ends, of the heat transfer plate (heat spreader 4), that face each other; therefore, it is made possible that the gap between the printed wire board (interposer substrate 3) and the heat spreader 4 is secured, that the productivity is raised, and that the airtightness of the sealing member 7 is enhanced.

The electric power semiconductor element 2 is a vertical semiconductor element such as an IGBT, also on the rear side of which the electrode 21E is formed, and the electrode portion (rear side electrode strip 33) formed on the printed wire board (interposer substrate 3) and the supporting portion 4s are electrically connected with each other; therefore, for example, the length of the opening portion 3a can be made shorter than the size of the element and hence the mounting area can further be reduced.

Embodiment 3

Figure 3:
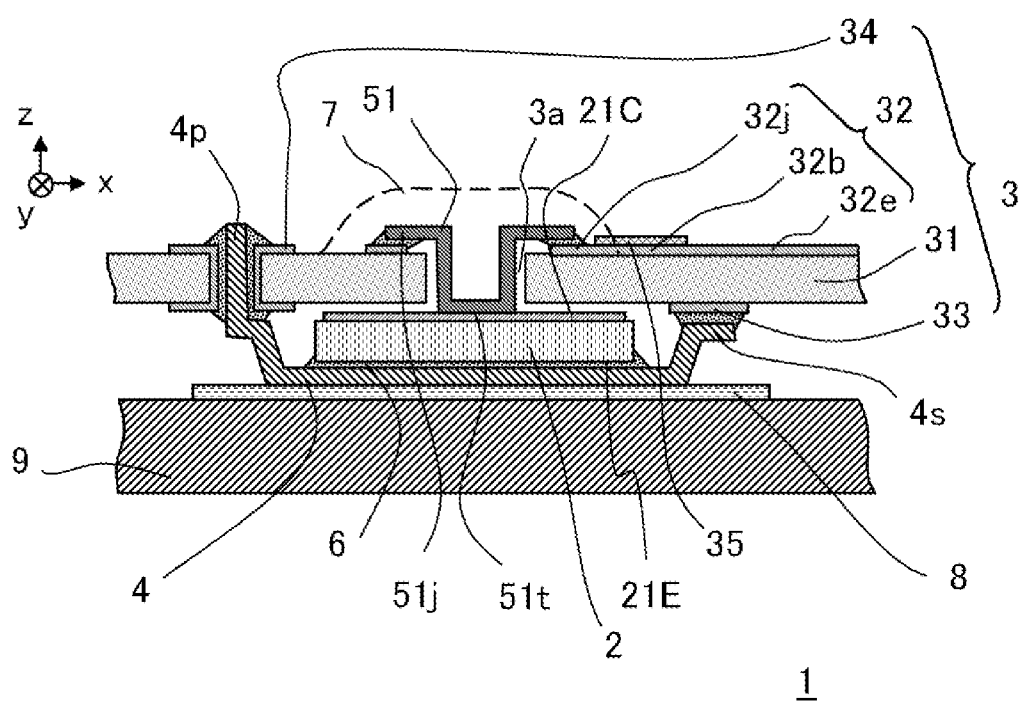
FIG. 3 is a partial cross-sectional view for explaining the configuration of an electric power semiconductor device according to Embodiment 3 of the present invention.

In comparison with each of Embodiments 1 and 2, the electric connection member between the front side electrode of the electric power semiconductor element and the interposer substrate is changed in Embodiment 3. Moreover, in comparison with Embodiment 2, the structure of the portion where the interposer substrate and the heat spreader are electrically connected is changed. FIG. 3 is a partial cross-sectional view for explaining the configuration of an electric power semiconductor device according to Embodiment 3 and corresponds to the partial cross-sectional view in Embodiment 2. In FIG. 3, the constituent elements that are the same as those explained in Embodiment 2 are designated by the same characters and the explanation therefor will be omitted.

As illustrated in FIG. 3, in Embodiment 3, not a bonding wire but an electrode member 51 is utilized for connecting the main power electrode 21C on the front side of the electric power semiconductor element 2 with a bonding electrode 32j (corresponding to the bonding electrode 32p explained in each of Embodiments 1 and 2) of the interposer substrate 3. The electrode member 51 is made of copper and has the shape of a so-called boater, i.e., a flat bottom portion 51t is formed on one end of a cylindrical body and a flange-shaped terminal portion 51j that extends toward the outer edge thereof is formed at the other end of the cylindrical body. The bottom portion 51t is inserted through the opening portion 3a, and ultrasonic bonding is applied to bond the main power electrode 21C with the bottom portion Sit; then, the terminal portion 51j is soldered with the bonding electrode 32j. As a result, an electric connection path from the main power electrode 21C on the front side of the electric power semiconductor element 2 to the outside is formed. In this case, the cross-sectional area of the electric connection path can readily be increased; thus, it is made possible to perform small-electric-resistance and high-reliability electric connection.

Moreover, one of the both ends of the heat spreader 4 is formed so as to be the supporting portion 4s as is the case with Embodiment 2; however, after being extended in the plane-extending direction (xy), as is the case with the supporting portion 4s, the other one thereof is formed so as to be a protrusion 4p that protrudes in the vertical direction (z). A through-hole coated with copper is formed at a position, in the interposer substrate 3, that corresponds to the protrusion 4p; the protrusion 4p that penetrates the through-hole is soldered with an electrode 34 in the through-hole. Accordingly, the position, with respect to the heat spreader 4, of the interposer substrate 3 is fixed, and an electric connection path to the rear side electrode 21E is formed on the front side of the interposer substrate 3.

As a result, it is made possible to fix the gap between the interposer substrate 3 and the heat spreader 4 without utilizing the potting resin 71 and to perform positioning in the plane-extending direction (xy). Additionally, as is the case with Embodiment 2, the opening portion 3a is downsized, so that the restriction on the arrangement of the front side electrode strip 32 is reduced; thus, the mounting area can further be decreased.

As described above, in the electric power semiconductor device 1 according to Embodiment 3, as the wiring member to be bonded with the main power electrode 21C, there is utilized the electrode member 51 in which the bottom portion 51t, which is a flat portion to be ultrasonic-bonded with the first bonding portion, and the terminal portion 51j to be soldered with the bonding electrode 32j, which is the second bonding portion, are provided; therefore, it is made possible to forma circuit whose electric resistance is smaller than that at a time when, for example, a solder bump and a through-hole are utilized.

Moreover, at least one of the supporting portions 4s formed at both ends, of the heat transfer plate (heat spreader 4), that face each other is provided with the protrusion 4p that penetrates the through-hole provided in the printed wire board (interposer substrate 3) and is exposed at the second side (the outside); therefore, positioning of the printed wire board (interposer substrate 3) in the plane-extending direction (xy) can readily be implemented.

Furthermore, the electric power semiconductor element 2 is a vertical semiconductor element such as an IGBT, also on the rear side of which the electrode 21E is formed, and the electrode 34 in the through-hole, which is the electrode portion of the printed wire board (interposer substrate 3) and the protrusion 4p of the supporting portion 4s are electrically connected with each other; therefore, the wiring can be performed by utilizing only one side (outer side) of the printed wire board (interposer substrate 3); thus, the wiring can efficiently be performed.

Embodiment 4

Figure 4:
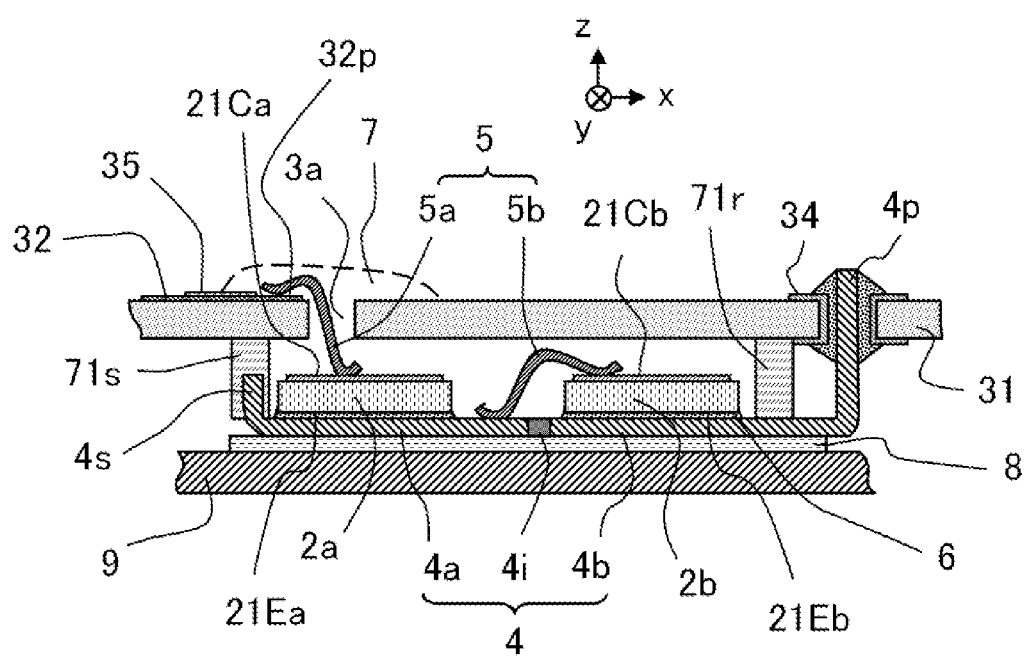
FIG. 4 is a partial cross-sectional view for explaining the configuration of an electric power semiconductor device according to Embodiment 4 of the present invention.

In comparison with each of Embodiments 1 through 3, the heat spreader is divided into a plurality of independent plates by an insulator in Embodiment 4; respective electric power semiconductor elements mounted on the independent plates are connected directly through wire bonding without utilizing wiring leads on the interposer substrate. Moreover, the protrusion of the heat spreader is divided into a plurality portions through insulation so that the respective portions can be utilized as external electrodes. FIG. 4 is a partial cross-sectional view for explaining the configuration of an electric power semiconductor device according to Embodiment 4 and corresponds to the partial cross-sectional view in Embodiment 2. In FIG. 4, the constituent elements that are the same as those explained in Embodiments 1 through 3 are designated by the same characters and the explanation therefor will be omitted.

As illustrated in FIG. 4, an insulating portion 4i formed of an insulating resin divides the heat spreader 4 into independent plates 4a and 4b and unillustrated depth-direction independent plates. A rear side electrode 21Ea of an electric power semiconductor element 2a and the independent plate 4a are soldered with the solder 6; a rear side electrode 21Eb of an electric power semiconductor element 2b and the independent plate 4b are soldered with the solder 6. As is the case with Embodiment 3, at one end (at the right side of the drawing) of the independent plate 4b, there is formed the protrusion 4p that penetrates a through-hole formed in the interposer substrate 3 and is soldered with the electrode 34 in the through-hole. In contrast, at one end (at the left side of the drawing) of the independent plate 4a, there is formed the supporting portion 4s that protrudes toward the interposer substrate 3 but does not reach the interposer substrate 3.

As the potting resin 71 which functions as a spacer, potting resins 71s and 71r are formed between the interposer substrate 3 and the heat spreader 4; as is the case with Embodiment 1, the potting resin 71r is formed in such a way as to be interposed between the independent plate 4b and the interposer substrate 3. In contrast, one end of the potting resin 71s abuts on the interposer substrate 3; however, the other end thereof is formed in such a way as to be penetrated by the supporting portion 4s.

The interposer substrate 3 is provided in such a way that at least part of a main power electrode 21Ca, which is the front side electrode of the electric power semiconductor element 2a adhered to the independent plate 4a, and an unillustrated control electrode 21Ga are exposed from the opening portion 3a formed therein. Out of the electrode strip 32, at least a bonding electrode 32p to be connected with the main power electrode 21Ca at the front side of the electric power semiconductor element 2a is disposed at a position where the bonding electrode 32p overlaps at least part of the main power electrode 21Ca when viewed in a direction (z) that is perpendicular to the plane of the interposer substrate 3.

The main power electrode 21Ca on the front side of the electric power semiconductor element 2a and the bonding electrode 32p are electrically connected with each other through wire bonding utilizing an aluminum bonding wire 5a having a thickness of 0.5 mm from a position above the interposer substrate 3. Also in Embodiment 4, the bonding electrode 32p to be connected with the control electrode 21Ga is also disposed at a position where the bonding electrode 32p overlaps at least part of the main power electrode 21Ca when viewed in the direction that is perpendicular to the plane of the interposer substrate 3. As is the case with the main power electrode 21Ca, the control electrode 21Ga is electrically connected with the gate-electrode bonding electrode 32p by use of a short-stroke-length bonding wire.

In contrast, no opening portion is formed at a position, in the interposer substrate 3, that is right above the electric power semiconductor element 2b adhered to the independent plate 4b; a main power electrode 21Cb of the electric power semiconductor element 2b is electrically connected with the independent plate 4a by use of a bonding wire 5b. The protrusion 4p electrically connects the front side electrode 34 of the interposer substrate 3 with the independent plate 4b to which the rear side electrode 21Eb of the electric power semiconductor element 2b is adhered. In other words, the electric power semiconductor elements 2a and 2b are connected in series with each other; one end thereof can be connected with the electrode strip 32 through the opening portion 3a, and the other end thereof can be connected with the electrode 34 by way of the protrusion 4p.

An unillustrated gate electrode 21Gb of the electric power semiconductor element 2b is electrically connected with an unillustrated independent plate 4c (situated at a position behind the independent plate 4b in the drawing) by use of the bonding wire 5; furthermore, the gate electrode 21Gb can be connected with the front side of the interposer substrate 3 by way of another unillustrated protrusion insulated from the protrusion 4p in the drawing.

In many cases, when in an electric power semiconductor device, a plurality of electric power semiconductor elements are utilized, a plurality of electric power semiconductor devices are utilized in such a way as to be connected with one another. In this situation, when the electric power semiconductor elements are connected directly with one another, the number of wiring leads can be reduced, in comparison with the case where all the electrodes of the electric power semiconductor elements are connected with interposer substrates by use of bonding wires. In this situation, the heat spreader 4 is preliminarily divided into a plurality of independent plates, and then an opening portion is provided for the electric power semiconductor element situated at a position that is one electrical end. In that case, it may also possible that the respective opening portions are provided for the both electric power semiconductor elements; however, it may also be allowed that as is the case with Embodiment 4, the protrusion 4p is utilized for the electric power semiconductor element situated at the other end.

In that case, when the two or more protrusions are insulated from one another, the protrusions can be utilized as external electrodes for electric connection. Coating the supporting portion 4s of the heat spreader 4 with an insulating resin (potting resin 71s) makes it possible to reinforce the supporting portion 4s while electrically insulating the supporting portion 4s. Furthermore, because the independent plates 4a, 4b, and so forth, which are insulated from one another, are mechanically coupled by the insulating portions 4i, electric connection (wire bonding) between the electric power semiconductor elements (one electric power semiconductor element and its neighboring independent plate) can be implemented on a single heat spreader 4.

As described above, in the electric power semiconductor device 1 according to Embodiment 4, the heat transfer plate (heat spreader 4) is configured with a plurality of electrically insulated independent plates 4a, 4b, and so forth; on the plurality of independent plates 4a, 4b, and so forth, a plurality of electric power semiconductor elements (2a, 2b) including the electric power semiconductor element 2a to which a wiring member (bonding wire 5a) is bonded, are separately mounted; among the plurality of electric power semiconductor elements, the electric power semiconductor elements mounted on different independent plates are electrically connected with each other by use of another wiring member (bonding wire 5b) disposed between the heat transfer plate (heat spreader 4) and the printed wire board (interposer substrate 3). Thus, by utilizing the space, downsizing can further be achieved.

As described in Embodiment 4, even when the protrusion 4p is formed in the heat spreader 4, the potting resin 71 can reduce the stress of screwing the board exerted on the soldering portion of the protrusion 4p. Accordingly, also in the electric power semiconductor device 1 according to any one of Embodiments 2 and 3, forming the potting resin 71, which is an insulator that functions as a spacer, as in Embodiment 1, makes it possible to reduce the stress of screwing the board exerted on the soldering portions of the supporting portion 4s and the protrusion 4p.

In each of forgoing Embodiments, even when instead of copper, aluminum, iron, or copper-tungsten is utilized as the material of the heat spreader 4, the same effect can be demonstrated. In each of forgoing Embodiments, there has been described a case where as the material for the wire bonding, aluminum is utilized; however, use of copper or a metal wire can demonstrate the same effect. There has been described a case where as the material for the soldering, Sn—Ag—Cu system is utilized; however, use of SnSb or SnBi can obtain the same effect. Furthermore, even when instead of solder, a conductive adhesive is utilized, the same effect can be obtained. It is also made possible to utilize heat conductive grease for the insulating layer 8, instead of a so-called insulation sheet. The resin forming the sealing member 7 can be replaced by a silicone gel, or the sealing member 7 may be omitted when no weather problem is posed.

In each of foregoing Embodiments, as an example of material, of the interposer substrate, that can readily be obtained without considering the heat conductivity, a glass-epoxy substrate has been described; however, even when a paper phenol substrate, a polyimide substrate, an alumina substrate, or an aluminum-based metal substrate is utilized, the same effect can be obtained.

In each of foregoing Embodiments, the position of the opening portion 3a is specified at least for the main power electrode among the front side electrodes. This is because in the case where the control electrode (21G) and the main power electrode (21C) are formed on the same side, the main power electrode (collector electrode 21C) occupies most part of the side and hence the method of making the electrode occupying the side and the opening portion 3a overlap each other raises the effect of reducing the mounting area. However, even when the opening portion 3a is made to overlap an electrode occupying small area, some effect is demonstrated; therefore, it is not necessarily required to make the opening portion 3a overlap the main power electrode. It goes without saying that the constituent elements in each of foregoing Embodiments 1 through 3 can be increased or decreased in number or can be combined with one another in an appropriate manner.

Each of the drawings utilized in the foregoing explanation of the electric power semiconductor device 1 is a schematic diagram in which only main members are illustrated; it goes without saying that in a practical electric power semiconductor device, various configurations are utilized. In each of the drawings, the electric power semiconductor element 2, which is a main heat source in the electric power semiconductor device 1, is not limited to an IGBT, but may be another switching device such as a MOSFET (Metal Oxide Semiconductor Field Effect Transistor) or a device that as a rectifying device, controls electric power. As an effect of the present invention, it has been described that even when a device whose front side electrode does not fit soldering is utilized, the heat radiation performance and downsizing can be secured; however, this does not suggest that a device that fits soldering, for example, a device having a front side electrode on which a copper or gold layer is formed, is excluded.

A so-called wide bandgap semiconductor whose base material is silicon carbide (SiC) is an example of suitable semiconductor material for remarkably demonstrating the effect of an electric power semiconductor device according to the present invention. As the material of a wide bandgap semiconductor, a gallium nitride-based material, a diamond, or the like is utilized in addition to silicon carbide.

For example, when as the electric power semiconductor element 2 that functions as a switching device or a rectifying device, a wide bandgap semiconductor element is utilized, the power loss thereof is smaller than that of a conventional element formed of silicon; thus, the efficiency of the electric power semiconductor device can be raised. Because the withstanding voltage and the allowable current density thereof are high, the electric power semiconductor device can be downsized. Moreover, because having a high heat resistance, a wide bandgap semiconductor element can be operated at a high temperature and hence it is made possible to downsize the heat radiation material 9 and to replace water cooling by air cooling; thus, the electric power semiconductor device can further be downsized.

However, an SiC element is characterized by being capable of withstanding a higher temperature than an Si element is; therefore, the use-temperature environment of an electric power semiconductor device in which the foregoing electric power semiconductor element 2 is mounted may reach a temperature region where the temperature is higher than a conventional temperature. Accordingly, the importance of the heat radiation performance further increases, and hence the effect of the present invention, i.e., the high heat radiation performance and the capability of downsizing are more remarkably demonstrated.

In other words, even when by taking advantage of the characteristics of a wide bandgap semiconductor, the downsizing and the efficiency hike are promoted, it is made possible to improve the heat-cycle resistance and the power-cycle resistance of an electric power semiconductor device and to achieve the lifetime prolongation of the electric power semiconductor device. That is to say, by exerting an effect of the present invention, the characteristics of a wide bandgap semiconductor can be utilized.

DESCRIPTION OF REFERENCE NUMERALS

1: electric power semiconductor device
2: electric power semiconductor element
21C: main power electrode (element electrode)
21E: rear side electrode
3: interposer substrate (printed wire board)
3a: opening portion
31: base material
32: electrode strip
32p: bonding electrode (2nd bonding portion)
32j: bonding electrode (2nd bonding portion)
33: rear side electrode strip (electrode portion)
34: through-hole electrode (electrode portion)
35: solder resist
4: heat spreader (heat transfer plate)
4s: supporting portion
4p: protrusion
5: bonding wire (wiring member)
8: insulating layer
9: heat radiation material
51: electrode member (wiring member)
51t: bottom portion (flat portion)
51j: terminal portion

The invention claimed is:

1. An electric power semiconductor device comprising:
a heat transfer plate, to the side opposite to the mounting side of which a heat radiation material is adhered through an insulating layer;
a printed wire board that is disposed in such a way as to face, with a predetermined gap, the mounting side of the heat transfer plate, on the side of which, opposite to the side facing the heat transfer plate, an electrode strip is formed, and in the vicinity of the electrode strip of which, an opening portion is provided;
an electric power semiconductor element that is disposed between the heat transfer plate and the printed wire board and whose rear side is adhered to the mounting side of the heat transfer plate; and
a wiring member, one end of which is bonded to a first bonding portion of an element electrode formed on the front side of the electric power semiconductor element and the other end of which is bonded to a second bonding portion of the electrode strip,
wherein the electrode strip and the opening portion are arranged in such a way that at least part of the second bonding portion is included in a space that extends from the element electrode to the printed wire board in a direction vertical to the mounting side and in such a way that the first bonding portion is included in a space that extends from the opening portion to the element electrode in the vertical direction.

2. The electric power semiconductor device according to claim 1, wherein the wiring member is a bonding wire, and the opening portion has a region necessary for bonding the bonding wire to the first bonding portion.

3. The electric power semiconductor device according to claim 1, wherein the wiring member is an electrode member in which a flat portion to be ultrasonic-bonded to the first bonding portion and a terminal portion to be soldered with the second bonding portion are provided.

4. The electric power semiconductor device according to claim 1, wherein a supporting portion that rises from the mounting side to the printed wire board and supports the printed wire board is formed at each of both ends, of the heat transfer plate, that face each other.

5. The electric power semiconductor device according to claim 2, wherein a supporting portion that rises from the mounting side to the printed wire board and supports the printed wire board is formed at each of both ends, of the heat transfer plate, that face each other.

6. The electric power semiconductor device according to claim 4, wherein at least one of the supporting portions formed at both ends that face each other is provided with a protrusion that penetrates a through-hole provided in the printed wire board and is exposed at a second side.

7. The electric power semiconductor device according to claim 5, wherein at least one of the supporting portions formed at both ends that face each other is provided with a protrusion that penetrates a through-hole provided in the printed wire board and is exposed at a second side.

8. The electric power semiconductor device according to claim 1,
wherein the electric power semiconductor element is a vertical semiconductor element, also on the rear side of which an electrode is formed, and
wherein a wiring member electrically connects the heat transfer plate with another bonding portion of the electrode strip through the opening portion.

9. The electric power semiconductor device according to claims 2,
wherein the electric power semiconductor element is a vertical semiconductor element, also on the rear side of which an electrode is formed, and
wherein a wiring member electrically connects the heat transfer plate with another bonding portion of the electrode strip through the opening portion.

10. The electric power semiconductor device according to claim 4,
wherein the electric power semiconductor element is a vertical semiconductor element, also on the rear side of which an electrode is formed, and
wherein an electrode portion formed on the printed wire board and the supporting portion are electrically connected with each other.

11. The electric power semiconductor device according to claim 5,
wherein the electric power semiconductor element is a vertical semiconductor element, also on the rear side of which an electrode is formed, and
wherein an electrode portion formed on the printed wire board and the supporting portion are electrically connected with each other.

12. The electric power semiconductor device according to claim 6,
wherein the electric power semiconductor element is a vertical semiconductor element, also on the rear side of which an electrode is formed, and
wherein an electrode portion formed on the printed wire board and the supporting portion are electrically connected with each other.

13. The electric power semiconductor device according to claim 7,
wherein the electric power semiconductor element is a vertical semiconductor element, also on the rear side of which an electrode is formed, and
wherein an electrode portion formed on the printed wire board and the supporting portion are electrically connected with each other.

14. The electric power semiconductor device according to claim 1, wherein the heat transfer plate is formed of a plurality of independent plates that are insulated from one another, wherein respective electric power semiconductor elements including electric power semiconductor elements, to each of which a wiring member is bonded, are mounted on the plurality of independent plates, and wherein among the plurality of electric power semiconductor elements, the electric power semiconductor elements mounted on different independent plates are electrically connected with each other by use of another wiring member disposed between the heat transfer plate and the printed wire board.

15. The electric power semiconductor device according to claim 2, wherein the heat transfer plate is formed of a plurality of independent plates that are insulated from one another, wherein respective electric power semiconductor elements including electric power semiconductor elements, to each of which a wiring member is bonded, are mounted on the plurality of independent plates, and wherein among the plurality of electric power semiconductor elements, the electric power semiconductor elements mounted on different independent plates are electrically connected with each other by use of another wiring member disposed between the heat transfer plate and the printed wire board.

16. The electric power semiconductor device according to claim 1, wherein the electric power semiconductor element is formed of a wide bandgap semiconductor material.

17. The electric power semiconductor device according to claim 2, wherein the electric power semiconductor element is formed of a wide bandgap semiconductor material.

18. The electric power semiconductor device according to claim 16, wherein the wide bandgap semiconductor material is any one of a silicon carbide, a gallium-nitride material, and a diamond.

19. The electric power semiconductor device according to claim 17, wherein the wide bandgap semiconductor material is any one of a silicon carbide, a gallium-nitride material, and a diamond.

* * * * *